(12) United States Patent
Abou Ghaida et al.

(10) Patent No.: US 8,434,033 B2
(45) Date of Patent: Apr. 30, 2013

(54) MASK ASSIGNMENT FOR MULTIPLE PATTERNING LITHOGRAPHY

(75) Inventors: Rani S. Abou Ghaida, Mount Kisco, NY (US); Kanak B. Agarwal, Austin, TX (US); Lars W. Liebmann, Poughquag, NY (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 13/223,706

(22) Filed: Sep. 1, 2011

(65) Prior Publication Data

US 2013/0061185 A1 Mar. 7, 2013

(51) Int. Cl.
 *G06F 17/50* (2006.01)
(52) U.S. Cl.
 USPC ............................................. 716/55; 716/52
(58) Field of Classification Search .............. 716/52, 716/55
 See application file for complete search history.

(56) References Cited

U.S. PATENT DOCUMENTS

| | | | |
|---|---|---|---|
| 2006/0253813 A1 | 11/2006 | Rittman | |
| 2008/0189672 A1 | 8/2008 | Shin et al. | |
| 2009/0125866 A1 | 5/2009 | Wang et al. | |
| 2010/0021055 A1 | 1/2010 | Socha | |
| 2011/0003254 A1 | 1/2011 | Chang et al. | |
| 2011/0004858 A1 | 1/2011 | Chang et al. | |
| 2011/0197168 A1 | 8/2011 | Chen et al. | |
| 2012/0047473 A1* | 2/2012 | Reid et al. | 716/53 |
| 2012/0196230 A1* | 8/2012 | Cho et al. | 430/319 |
| 2012/0216157 A1* | 8/2012 | Luo et al. | 716/55 |

OTHER PUBLICATIONS

Office Action mailed May 24, 2012 for U.S. Appl. No. 13/171,530; 15 pages.
Notice of Allowance mailed Sep. 17, 2012 for U.S. Appl. No. 13/171,530, 5 pages.
Response to Office Action filed with the USPTO on Aug. 24, 2012 for U.S. Appl. No. 13/171,530; 11 pages.
U.S. Appl. No. 13/171,530.
Abou Ghaida, Rani S. et al., USPTO U.S. Appl. No. 13/171,530, filed Jun. 29, 2011, 31 pages.
Chen, Szu-Yu et al., "Native-Conflict-Aware Wire Perturbation for Double Patterning Technology", 2010/IEEE International Conference on Computer-Aided Design (ICCAD), San Jose, California, Nov. 7-11, 2010, pp. 556-561.

(Continued)

*Primary Examiner* — Suresh Memula
(74) *Attorney, Agent, or Firm* — Stephen R. Tkaes; Stephen J. Walder, Jr.; Eustus D. Nelson (57) ABSTRACT

A mechanism is provided for mask assignment for triple patterning lithography. The mechanism identifies tip-to-tip (TT), tip-to-side (TS), and side-to-side (SS) conflicting parts by design rule dependent projection. The mechanism finds stitch location for TT, TS, and SS conflicts separately. The mechanism colors TT, TS, and SS conflicting parts with mask0/mask1, mask0/mask2, mask1/mask2 coloring cycle with each type colored separately. The mechanism uses existing infrastructure of two-way coloring. As a first objective, the mechanism attempts to minimize conflicts. As a second objective, the mechanism attempts to minimize the number of stitches by assigning the two sides of stitches to the same mask. Once coloring of all conflicting parts is done, the mechanism colors non-conflicting parts to maximize minimum overlap of exposures and to use both colors if two sides are different colors and one color if both sides are the same color.

20 Claims, 6 Drawing Sheets

OTHER PUBLICATIONS

Chiou, Tsan-Bim et al., "Development of Layout Split Algorithms and Printability Evaluation for Double Patterning Technology", Proc. of SPIE vol. 6924, 2008, 10 pages.

Drapeau, Martin et al., "Double Patterning Design Split Implementation and Validation for the 32nm Node", Proc. of SPIE vol. 6521, 2007, 15 pages.

Hsu, Chin-Hsiung et al., "Simultaneous Layout migration and Decomposition for Double Patterning Technology", 2009 ACM International Conference on Computer-Aided Design (ICCAD), San Jose, California, Nov. 2-5, 2009, pp. 595-600.

Kahng, Andrew B. et al., "Layout Decomposition for Double Patterning Lithography", ICCAD'08, San Jose, California, Nov. 10-13, 2008, 8 pages.

Yuan, Kun et al., "Double Patterning Layout Decomposition for Simultaneous Conflict and Stitch Minimization", ISPD '09, Mar. 29-Apr. 1, 2009, ACM, pp. 107-114.

\* cited by examiner

FIG. 5A
LAYOUT

FIG. 5B
PROJECTION OF ALL DR

FIG. 5C
PROJECTION OF TT AND TS

FIG. 5D
M0/M1 COLORING

FIG. 5E
M0/M2 COLORING

FIG. 5F
M1/M2 COLORING

FIG. 5G
M0/M1 COLORING OF SS CONF

FIG. 5H
M1/M2 COLORING OF SS CONF

MASK ASSIGNMENT FOR MULTIPLE PATTERNING LITHOGRAPHY

BACKGROUND

The present application relates generally to an improved data processing apparatus and method and more specifically to mechanisms for mask assignment (a.k.a. layout decomposition) for multiple patterning lithography.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

Multiple patterning is a class of technologies developed for photolithography to enhance the feature density. The simplest case of multiple patterning is double patterning, where a conventional lithography process is enhanced to produce double the expected number of features. Double exposure is a sequence of two separate exposures of the same photoresist layer using two different photomasks. This technique is commonly used for patterns in the same layer which have incompatible densities or pitches. In one important case, the two exposures may each consist of lines which are oriented in one or the other of two usually perpendicular directions. This allows the decomposition of two-dimensional patterns into two one-dimensional patterns which are easier to print.

Double pattern lithography (DPL) is an effective technique to improve resolution. DPI, theoretically doubles resolution through pitch splitting such that effective pitch of the layout for each patterning step is halved. DPL involves two separate exposures and etch/freeze steps (litho-etch-litho-etch or litho-freeze-litho-etch). DPL is expected to be needed for 20 nm technology and is one of the best candidate solutions for scaling to 14 nm technology and beyond.

For one-dimensional patterns at minimum pitch, layout decomposition for double patterning is trivial. Decomposition is very complex for more complicated two-dimensional patterns. DPL layout decomposition solutions typically cast layout decomposition as a graph coloring problem where two features less than a certain minimum spacing must be assigned different colors. DPL decomposition is very challenging to implement at the full-chip level when stitch insertion is considered. A stitch insertion in a polygon during decomposition indicates that one part of the polygon will be printed in the first patterning step while the remaining part of the polygon will be printed using second patterning, with the two parts joining together at the stitch location. Stitches can help in removing some decomposition conflicts but they can potentially break a polygon into multiple pieces. Conflicts that cannot be removed with stitch insertion require layout modification (sometimes major), which can be very challenging and costly (increase layout area). As a result, considering all candidate stitch insertion locations during layout decomposition is crucial to take full advantage of stitching capability.

SUMMARY

In one illustrative embodiment, a method, in a data processing system, is provided for layout decomposition for triple patterning lithography. The method comprises receiving a design layout for performing a triple patterning photolithographic process to form an integrated circuit design. The method comprises using multiple steps of double-patterning decomposition to perform layout decomposition for triple patterning. The method comprises performing the layout decomposition for features that involve different types of spacing violations (such as tip-to-tip, tip-to-side, and side-to-side spacing violations) in separate steps so as not to miss on candidate stitch locations. The method further comprises finding candidate stitch locations for features involving the different types of spacing violations. The method is scalable and can be used to perform layout decomposition for multiple patterning with k-colors (k greater than or equal to 3). The method further comprises performing the multiple patterning photolithographic process using the multiple patterning colored design layout.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for layout decomposition for triple patterning lithography. The method uses multiple steps of double-patterning (DP) decomposition to perform the layout decomposition for triple patterning (TP). The method comprises performing the decomposition for features that involve different types of spacing violations (such as tip-to-tip, tip-to-side, and side-to-side spacing violations) in separate steps so as not to miss candidate stitch locations. The mechanism identifies tip-to-tip (TT), tip-to-side (TS), and side-to-side (SS) conflicting parts as well as candidate stitch locations in each decomposition case by design rule-dependent projection. The mechanism colors TT, TS, and SS conflicting parts with mask0/mask1, mask0/mask2, mask1/mask2 coloring cycle with each type colored separately.

As a first objective, the mechanism attempts to minimize conflicts. As a second objective, the mechanism attempts to minimize the number of stitches. Once coloring of all conflicting parts is done, the mechanism colors non-conflicting parts to maximize the minimum overlap of exposures and achieve density balancing between the different mask layouts. In particular, non-conflicting parts are colored with only the colors of all touching conflicting parts, which were colored previously. In other words, if a non-conflicting part touches two conflicting parts colored differently, it is colored with both colors of the touching parts; if a non-conflicting part touches a single conflicting part, it is colored with a single color, the color of the touching conflicting part to avoid a stitch. Isolated non-conflicting parts, which can be colored with any color without creating a coloring conflict, are colored so that the feature density is more balanced across the different masks (ideally achieving equal densities).

Triple patterning process may be considered for 14 nm metal patterning. Triple patterning may use a litho-etch-litho-etch-litho-etch, or LELELE, technique. The flow begins with a sub-resolution layout, which is the target design to be achieved. The flow makes a first exposure, performs an etch, makes a second exposure, performs an etch, makes a third exposure, and performs a final etch. Ideally, the final result should resemble the sub-resolution layout. In accordance with an illustrative embodiment, the third exposure over DP can be used either to achieve improved pitch relaxation (on each mask layout), to significantly reduce the TT and TS minimum spacing rules, or the combination of both. Three-way coloring is required for the application of triple patterning. Three-way coloring is significantly more challenging than two-way coloring. Simply determining whether a layout is three-way colorable is a NP-complete problem; whereas determining whether the layout is two-way colorable is done in linear time.

Figure 1A:
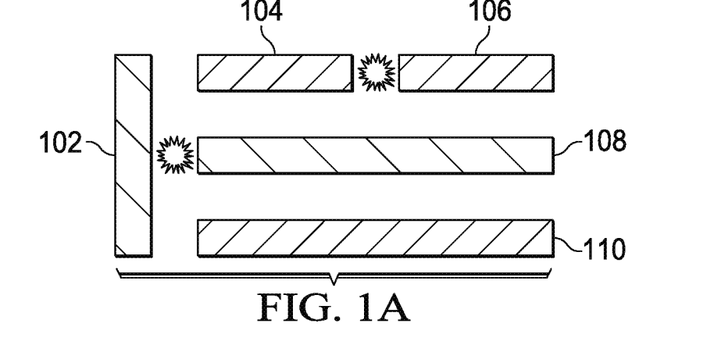
FIGS. 1A and 1B illustrate double patterning versus triple patterning lithography in accordance with an illustrative embodiment.
Figure 1B:
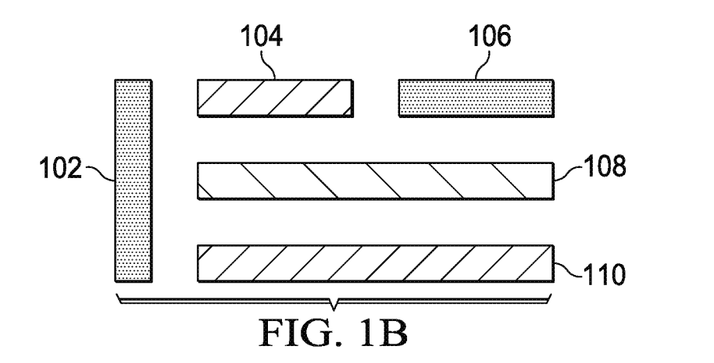

FIGS. 1A and 1B illustrate double patterning versus triple patterning lithography in accordance with an illustrative embodiment. FIG. 1A shows an example design layout with vertical shape 102 and horizontal shapes 104, 106, 108, and 110. Shapes 102 and 108 are colored with a first mask, and shapes 104, 106, and 110 are colored with a second mask. As shown in FIG. 1A, a coloring conflict exists between shapes 104 and 106. The minimum tip-to-tip and tip-to-side spacing rules are constrained by the two-color conflicts. In other words, TT and TS must be significantly larger than the minimum spacing between any two features in the layout to prevent conflicts.

In the example shown in FIG. 1B, shape 108 is colored with a first mask, shapes 104 and 110 are colored with a second mask, and shapes 102 and 106 are coloredwith a third mask. As shown in FIG. 1B, the minimum tip-to-tip and tip-to-side spacing are enabled by three-way coloring with no coloring conflicts.

Figure 2A:
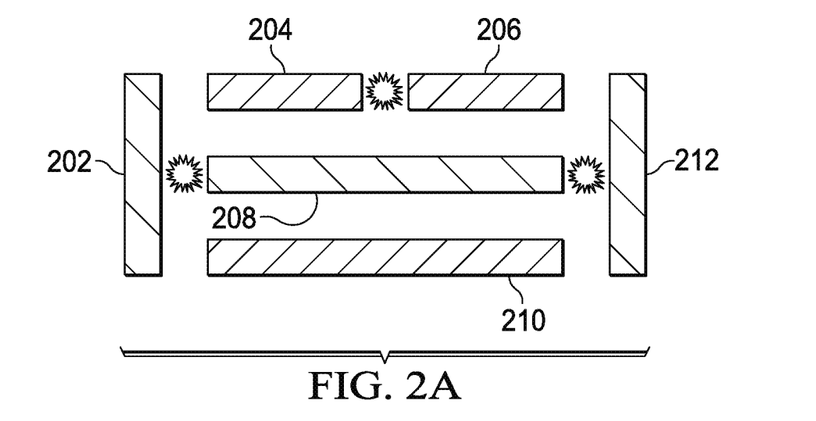
FIGS. 2A-2C depict extending two-way coloring to three-way coloring in accordance with an illustrative embodiment.
Figure 2B:
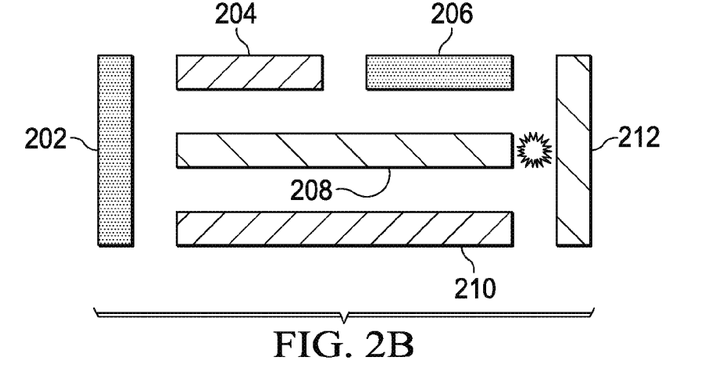
Figure 2C:
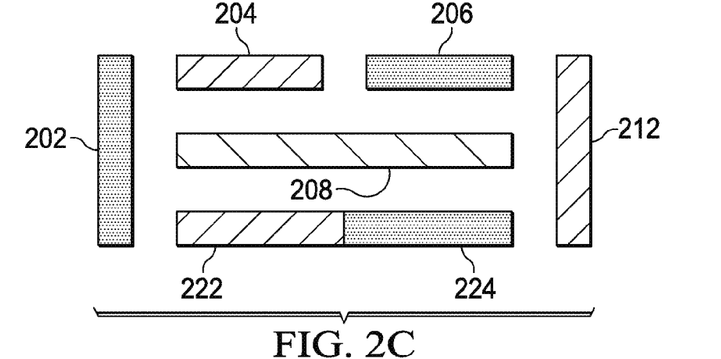

FIGS. 2A-2C depict extending two-way coloring to three-way coloring in accordance with an illustrative embodiment. FIG. 2A shows an example design layout with vertical shapes 202 and 212 and horizontal shapes 204, 206, 208, and 210. Shapes 202, 208, and 212 are colored with a first mask, and shapes 204, 206, and 210 are colored with a second mask. As shown in FIG. 2A, coloring conflicts exists between shapes 204 and 206, between shapes 202 and 208, and between shapes 208 and 212.

FIG. 2B shows the design layout with naïve extension of two-way coloring solution to three-way coloring by coloring with two colors first and resolving conflicts by moving conflicting features to a third color. This approach is intuitive, but sub-optimal, because coloring conflicts cannot always be resolved by modifying only the conflicting features. In the example shown in FIG. 2B, features 204 and 210 are colored with a third mask to resolve two of the three conflicts shown in FIG. 2A. As seen in FIG. 2B, a coloring conflict exists between shapes 208 and 212.

FIG. 2C shows the design layout with three-way coloring with stitch insertion. In the example shown in FIG. 2C, shape 210 is split into shapes 222 and 224 with a stitch between shapes 222 and 224. Shapes 204, 222, and 212 are colored with mask 3, and shapes 206 and 224 are colored with mask 2, resolving all conflicts.

Figure 3:
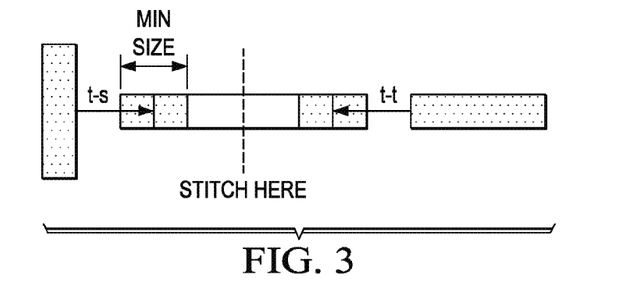
FIG. 3 illustrates finding a stitch location in accordance with the illustrative embodiment.

FIG. 3 illustrates finding a stitch location in accordance with the illustrative embodiment. The minimum size is the minimum size a feature must have to be printable. The values TS and TT represent the line-end (a.k.a. tip) to line-side and the line-end to line-end minimum spacing requirement for features of the same mask, which must be obeyed across all masks for the layout to be manufacturable.

For the case of DP layout decomposition, candidate stitch insertion locations are non-conflicting parts after performing projection with all types of spacing violations. A stitch is beneficial only if it is in non-conflicting parts and only if the non-conflicting part is wider than the requirement on the minimum length of the masks overlap.

This is not true for triple patterning (TP) layout decomposition, however. In this case, a stitch can be between mask0 and mask1, mask0 and mask2, and mask1 and mask2 and possible stitch locations are not limited to non-conflicting parts only. If projection is extended for TP to find candidate stitch locations (as in FIG. 5B) and candidate stitch locations are assumed to be in non-conflicting parts only, a very large number of possible stitch locations will not be detected (zero candidate stitch locations in FIG. 5B while the layout has many possible stitch locations).

In accordance with the illustrative embodiment, a mechanism is provided for three-way coloring for triple patterning lithography in accordance with an illustrative embodiment. The mechanism identifies tip-to-tip (TT), tip-to-side (TS), and side-to-side (SS) conflicting parts by design rule dependent projection.

Figure 4:
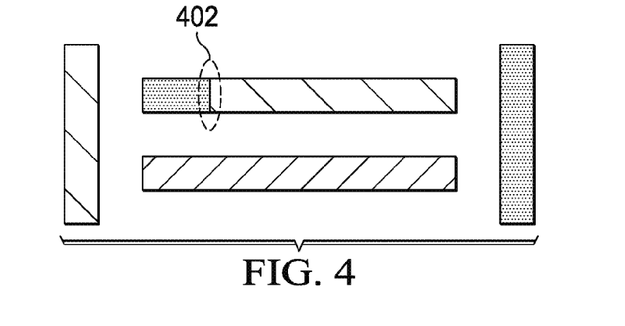
FIG. 4 depicts a three-way coloring with a stitch location in accordance with an illustrative embodiment.

The mechanism may find stitch locations for TT, TS, and SS conflicts separately. The mechanism colors TT, TS, and SS conflicting parts with mask0/mask1, mask0/mask2, and mask1/mask2 coloring cycle with each type colored separately. The mechanism uses existing infrastructure of two-way coloring. Coloring TT, TS, and SS conflicting parts in separate steps prevents the loss of candidate stitch locations. FIG. 4 depicts a three-way coloring with a stitch location in accordance with an illustrative embodiment. Projection fails to detect stitch 402 if SS rule is included and the coloring of all types of conflicting parts is performed in a single step.

Figure 5A:
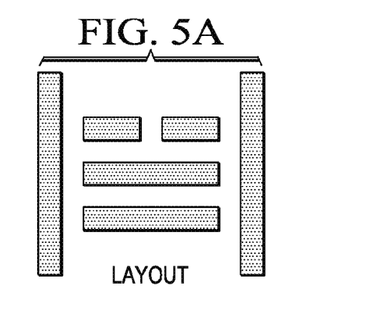
FIGS. 5A-5H illustrate mask assignment for triple patterning in accordance with an illustrative embodiment.
Figure 5B:
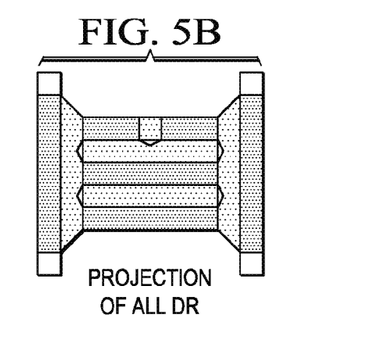
Figure 5C:
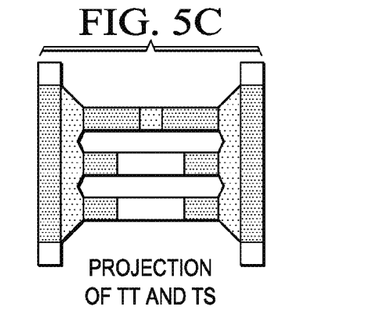
Figure 5D:
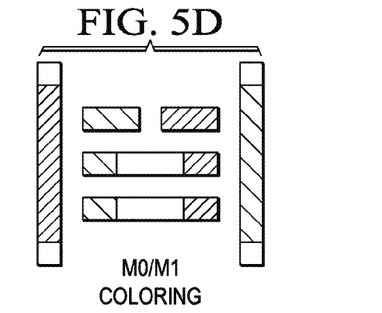
Figure 5E:
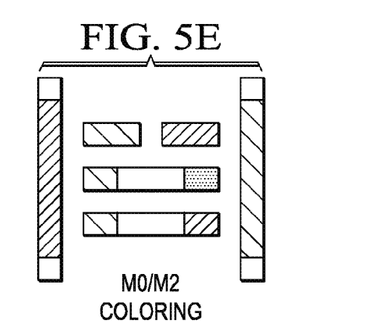
Figure 5F:
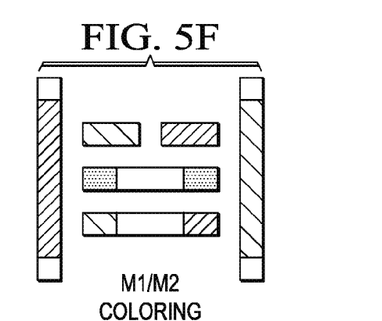
Figure 5G:
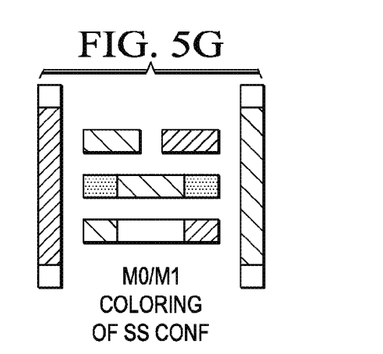
Figure 5H:
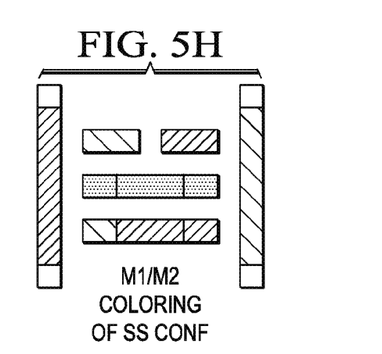

FIGS. 5A-5H illustrate mask assignment for triple patterning in accordance with an illustrative embodiment. FIG. 5A depicts a design layout. FIG. 5B illustrates projection considering all types of spacing rules. FIG. 5C depicts projection of tip-to-tip and tip-to-side spacing rules without side-to-side spacing rule). In the depicted example, the mechanism considers tip-to-tip and tip-to-side together; however, the mechanism may consider tip-to-tip and tip-to-side separately. FIG. 5D depicts mask0/mask1 two-way coloring; FIG. 5E depicts mask0/mask2 two-way coloring; and, FIG. 5F depicts mask1/mask2 two-way coloring. FIG. 5G depicts mask0/mask1 coloring of side-to-side conflicts. FIG. 5H depicts mask1/mask2 coloring of side-to-side conflicts.

Figure 6:
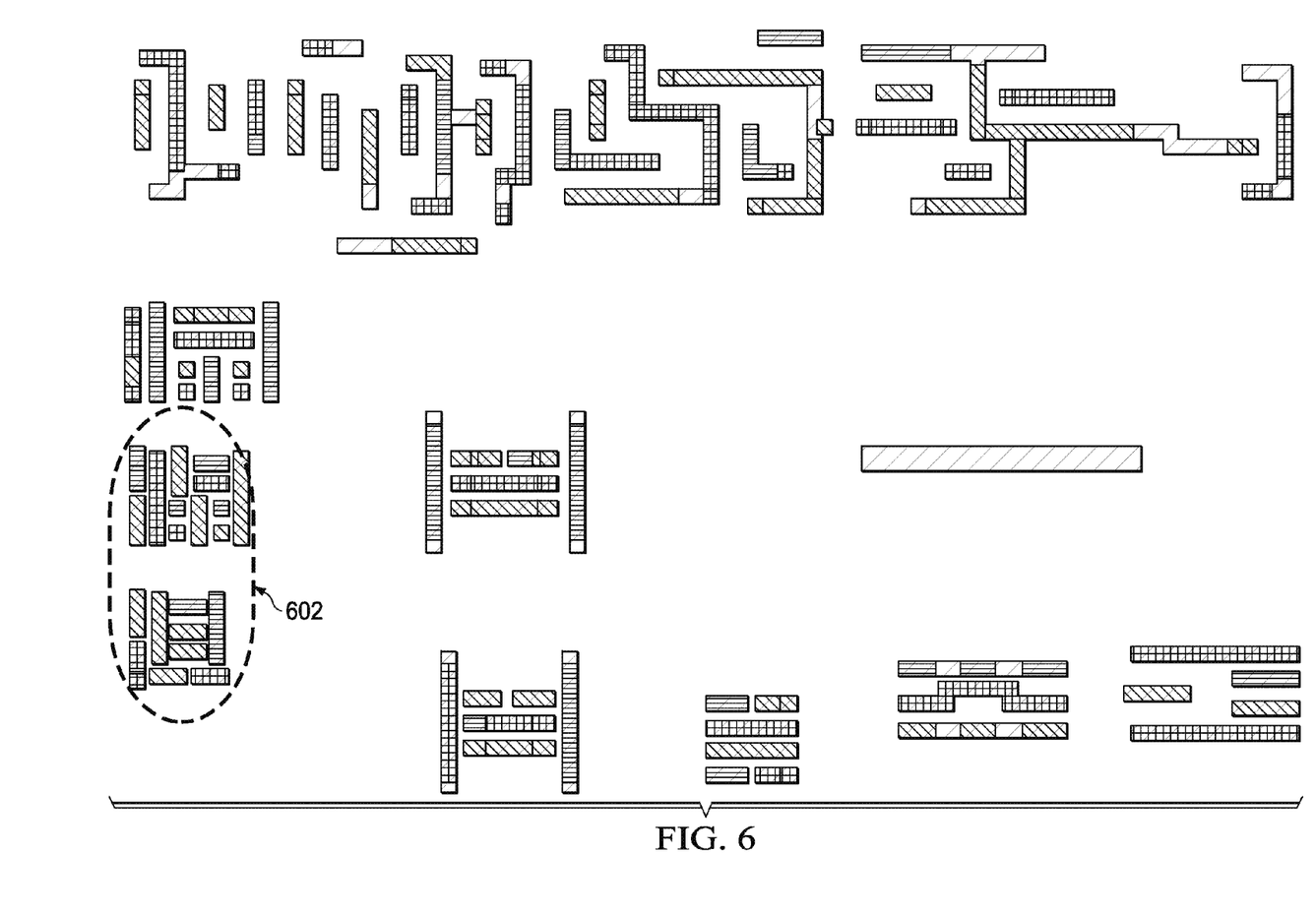
FIG. 6 depicts an example design layout with three-way coloring in accordance with an illustrative embodiment.

FIG. 6 depicts an example design layout with three-way coloring in accordance with an illustrative embodiment. As seen in the example of FIG. 6, the design has an area 602 that is uncolorable with three masks.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram Hock or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 7:
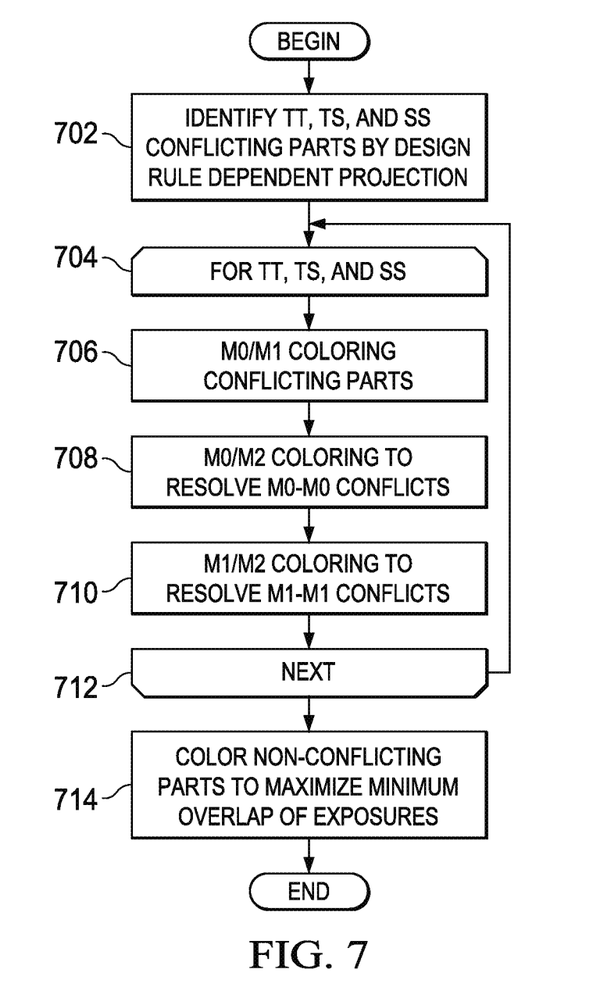
FIG. 7 is a flowchart illustrating operation of a mechanism for mask assignment for triple patterning lithography in accordance with an illustrative embodiment.

FIG. 7 is a flowchart illustrating operation of a mechanism for mask assignment for tiple patterning lithography in accordance with an illustrative embodiment. Operation begins when the mechanism receives a design layout, and the mechanism identifies tip-to-tip (TT), tip-to-side (TS), and side-to-side (SS) conflicting parts by design rule dependent projection (block 702). The mechanism begins a loop for all TT, TS, and SS (block 704). That is in the first iteration of the loop, the mechanism performs coloring for tip-to-tip conflicts, then repeats the loop tip-to-side conflicts, and in the last iteration performs coloring for side-to-side conflicts.

The mechanism performs mask0/mask1 coloring for conflicting parts (block 706). The mechanism performs mask0/mask2 coloring to resolve mask0-to-mask0 conflicts (block 708). Then, the mechanism performs mask1/mask2 coloring to resolve mask1-to-mask1 conflicts (block 710).

Then, the mechanism considers the next of TT, TS, and SS conflicts (block 712), and operation returns to block 704 to repeat the loop. After performing mask assignment to resolve side-to-side conflicts, operation proceeds from block 712 to block 714 to color non-conflicting parts to maximize minimum overlap of exposures (block 714). Thereafter, operation ends.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 8:
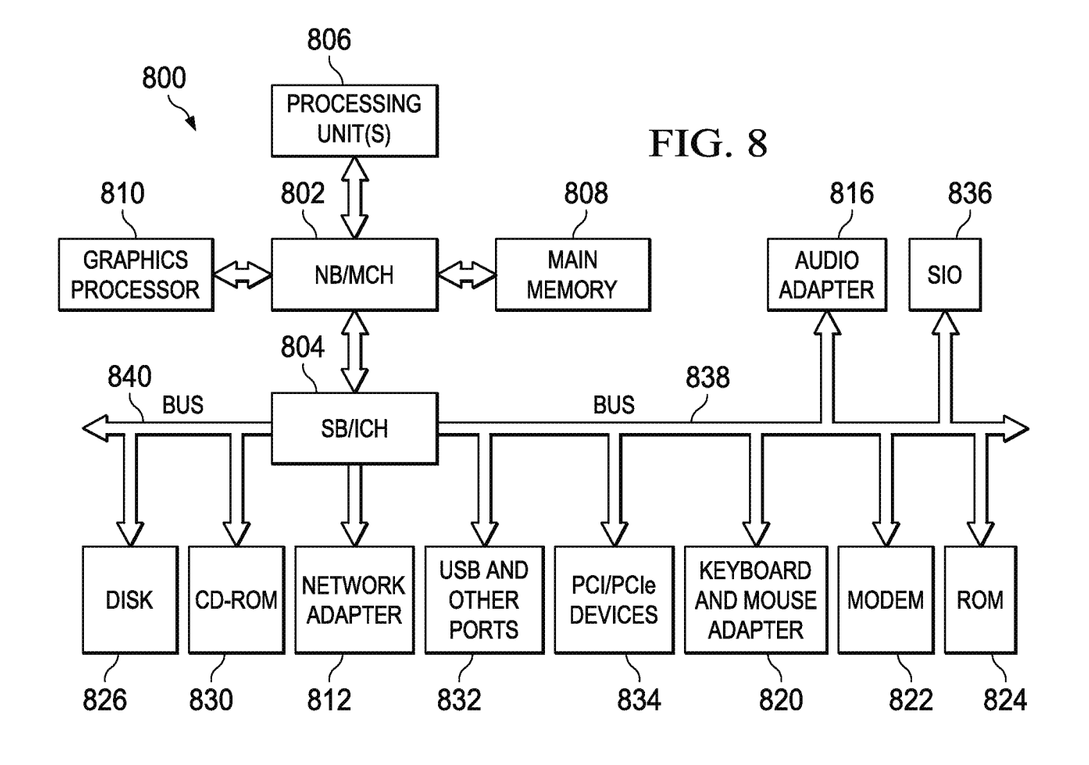
FIG. 8 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments. FIG. 8 is provided hereafter as an example environment in which aspects of the illustrative embodiments may be implemented. It should be appreciated that FIG. 8 is only an example and is not intended to assert or imply any limitation with regard to the environments in which aspects or embodiments of the present invention may be implemented. Many modifications to the depicted environment may be made without departing from the spirit and scope of the present invention.

FIG. 8 is a block diagram of an example data processing system in which aspects of the illustrative embodiments may be implemented. Data processing system 800 is an example of a computer in which computer usable code or instructions implementing the processes for illustrative embodiments of the present invention may be located.

In the depicted example, data processing system 800 employs a hub architecture including north bridge and memory controller hub (NB/MCH) 802 and south bridge and input/output (I/O) controller hub (SB/ICH) 804. Processing unit 806, main memory 808, and graphics processor 810 are connected to NB/MCH 802. Graphics processor 810 may be connected to NB/MCH 802 through an accelerated graphics port (AGP).

In the depicted example, local area network (LAN) adapter 812 connects to SB/ICH 804. Audio adapter 816, keyboard and mouse adapter 820, modem 822, read only memory (ROM) 824, hard disk drive (HDD) 826, CD-ROM drive 830, universal serial bus (USB) ports and other communication ports 832, and PCI/PCIe devices 834 connect to SB/ICH 804 through bus 838 and bus 840, PCFPCIe devices may include, for example, Ethernet adapters, add-in cards, and PC cards for notebook computers. PCI uses a card bus controller, while PCIe does not, ROM 824 may be, for example, a flash basic input/output system (BIOS).

HDD 826 and CD-ROM drive 830 connect to SB/ICH 804 through bus 840, HDD 826 and CD-ROM drive 830 may use, for example, an integrated drive electronics (IDE) or serial advanced technology attachment (SATA) interface. Super I/O (SIO) device 836 may be connected to SB/ICH 804.

An operating system runs on processing unit 806. The operating system coordinates and provides control of various components within the data processing system 800 in FIG. 8. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 800 (Java is a trademark of Oracle and/or its affiliates).

As a server, data processing system 800 may be, for example, an IBM® eServer™ System p® computer system, running the Advanced Interactive Executive) (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 800 may be a symmetric multiprocessor (SMP) system including a plurality of processors in processing unit 806. Alternatively, a single processor system may be employed.

Instructions for the operating system, the object-oriented programming system, and applications or programs are located on storage devices, such as HDD 826, and may be loaded into main memory 808 for execution by processing unit 806. The processes for illustrative embodiments of the present invention may be performed by processing unit 806 using computer usable program code, which may be located in a memory such as, for example, main memory 808, ROM 824, or in one or more peripheral devices 826 and 830, for example.

A bus system, such as bus 838 or bus 840 as shown in FIG. 8, may be comprised of one or more buses. Of course, the bus system may be implemented using any type of communication fabric or architecture that provides for a transfer of data between different components or devices attached to the fabric or architecture. A communication unit, such as modem 822 or network adapter 812 of FIG. 8, may include one or more devices used to transmit and receive data. A memory may be, for example, main memory 808, ROM 824, or a cache such as found in NB/MCH 802 in FIG. 8.

Those of ordinary skill in the art will appreciate that the hardware in FIG. 8 may vary depending on the implementation. Other internal hardware or peripheral devices, such as flash memory, equivalent non-volatile memory, or optical disk drives and the like, may be used in addition to or in place of the hardware depicted in FIG. 8. Also, the processes of the illustrative embodiments may be applied to a multiprocessor data processing system, other than the SMP system mentioned previously, without departing from the spirit and scope of the present invention.

Moreover, the data processing system 800 may take the form of any of a number of different data processing systems including client computing devices, server computing devices, a tablet computer, laptop computer, telephone or other communication device, a personal digital assistant (PDA), or the like. In some illustrative examples, data processing system 800 may be a portable computing device which is configured with flash memory to provide non-volatile memory for storing operating system files and/or user-generated data, for example. Essentially, data processing system 800 may be any known or later developed data processing system without architectural limitation.

Thus, the illustrative embodiments provide mechanisms for mask assignment for triple patterning lithography. The mechanism identifies tip-to-tip (TT), tip-to-side (TS), and side-to-side (SS) conflicting parts by design rule dependent projection. The mechanism finds stitch location for TT, TS, and SS conflicts separately. The mechanism colors TT, TS, and SS conflicting parts with mask0/mask1, mask0/mask2, mask1/mask2 coloring cycle with each type colored separately. The mechanism uses existing infrastructure of two-way coloring mapping. As a first objective, the mechanism attempts to minimize conflicts. As a second objective, the mechanism attempts to minimize the number of stitches by assigning the two sides of stitches to the same mask. Once coloring of all conflicting parts is done, the mechanism colors non-conflicting parts to maximize the minimum overlap of exposures and to use both colors if two sides are different colors and one color if both sides are the same color.

The mechanisms of the illustrative embodiments address key challenges of layout decomposition for triple patterning lithography implementations in 14 mm node and beyond. The illustrative embodiments resolve tip-to-tip and tip-to-side spacing conflicts of double patterning. The illustrative embodiments present a solution that is significantly more effective than finding conflicts in two-way coloring and resolving them by moving conflicting parts to a third color.

The illustrative embodiments and depicted examples show triple patterning lithography; however, the aspects of the illustrative embodiments may apply to four or more exposures.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for layout decomposition in multiple patterning lithography, the method comprising:

receiving a design layout for performing a multiple patterning photolithographic process to form an integrated circuit design;

identifying tip-to-tip, tip-to-side, and side-to-side conflicts between design features in the design layout using design rule dependent projection;

finding stitch locations for tip-to-tip, tip-to-side, and side-to-side conflicts separately to form a multiple patterning colored design layout; and performing the multiple patterning photolithographic process using the multiple patterning colored design layout.

2. The method of claim 1, wherein coloring conflicting parts comprises:

performing a first two-way coloring of the design layout for a first mask and a second mask;

performing a second two-way coloring of the design layout for the first mask and a third mask; and performing a third two-way coloring of the design layout for the second mask and the third mask.

3. The method of claim 2, wherein performing the second two-way coloring comprises resolving first-mask-to-first-mask conflicts.

4. The method of claim 3, wherein performing the third two-way coloring comprises resolving second-mask-to-second-mask conflicts.

5. The method of claim 2, wherein finding stitch locations comprises:

performing the first two-way coloring, the second two-way coloring, and the third two-way coloring for tip-to-tip conflicts;

performing the first two-way coloring, the second two-way coloring, and the third two-way coloring for tip-to-side conflicts; and performing the first two-way coloring, the second two-way coloring, and the third two-way coloring for side-to-side conflicts.

6. The method of claim 2, wherein finding stitch locations further comprises:

coloring non-conflicting parts to maximize minimum overlap of exposures.

7. The method of claim 2, wherein finding stitch locations comprises:

performing the first two-way coloring, the second two-way coloring, and the third two-way coloring for tip-to-tip and tip-to-side conflicts; and performing the first two-way coloring and the third two-way coloring for side-to-side conflicts.

8. A computer program product comprising a computer readable storage medium having a computer readable program stored therein, wherein the computer readable program, when executed on a computing device, causes the computing device to:

receive a design layout for performing a multiple patterning photolithographic process to form an integrated circuit design;

identify tip-to-tip, tip-to-side, and side-to-side conflicts between design features in the design layout using design rule dependent projection;

find stitch locations for tip-to-tip, tip-to-side, and side-to-side conflicts separately to form a multiple patterning colored design layout; and perform the multiple patterning photolithographic process using the multiple patterning colored design layout.

9. The computer program product of claim 8, wherein finding stitch locations comprises:

performing a first two-way coloring of the design layout for a first mask and a second mask;

performing a second two-way coloring of the design layout for the first mask and a third mask; and performing a third two-way coloring of the design layout for the second mask and the third mask.

10. The computer program product of claim 9, wherein performing the second two-way coloring comprises resolving first-mask-to-first-mask conflicts.

11. The computer program product of claim 10, wherein performing the third two-way coloring comprises resolving second-mask-to-second-mask conflicts.

12. The computer program product of claim 9, wherein finding stitch locations comprises:

performing the first two-way coloring, the second two-way coloring, and the third two-way coloring for tip-to-tip conflicts;

performing the first two-way coloring, the second two-way coloring, and the third two-way coloring for tip-to-side conflicts; and performing the first two-way coloring, the second two-way coloring, and the third two-way coloring for side-to-side conflicts.

13. The computer program product of claim 9, wherein finding stitch locations further comprises:

coloring non-conflicting parts to maximize minimum overlap of exposures.

14. The computer program product of claim 9, wherein finding stitch locations comprises:

performing the first two-way coloring, the second two-way coloring, and the third two-way coloring for tip-to-tip and tip-to-side conflicts; and performing the first two-way coloring and the third two-way coloring for side-to-side conflicts.

15. The computer program product of claim 9, wherein the computer readable program is stored in a computer readable storage medium in a data processing system and wherein the computer readable program was downloaded over a network from a remote data processing system.

16. The computer program product of claim 9, wherein the computer readable program is stored in a computer readable storage medium in a server data processing system and wherein the computer readable program is downloaded over a network to a remote data processing system for use in a computer readable storage medium with the remote system.

17. An apparatus, comprising:

a processor; and a memory coupled to the processor, wherein the memory comprises instructions which, when executed by the processor, cause the processor to:

receiving a design layout for performing a multiple patterning photolithographic process to form an integrated circuit design;

identifying tip-to-tip, tip-to-side, and side-to-side conflicts between design features in the design layout using design rule dependent projection;

finding stitch locations for tip-to-tip, tip-to-side, and side-to-side conflicts separately to form a multiple patterning colored design layout; and performing the multiple patterning photolithographic process using the multiple patterning colored design layout.

18. The apparatus of claim 17, wherein finding stitch locations comprises:

performing a first two-way coloring of the design layout for a first mask and a second mask;

performing a second two-way coloring of the design layout for the first mask and a third mask; and performing a third two-way coloring of the design layout for the second mask and the third mask.

19. The apparatus of claim 18, wherein finding stitch locations comprises:

performing the first two-way coloring, the second two-way coloring, and the third two-way coloring for tip-to-tip conflicts;

performing the first two-way coloring, the second two-way coloring, and the third two-way coloring for tip-to-side conflicts; and performing the first two-way coloring, the second two-way coloring, and the third two-way coloring for side-to-side conflicts.

20. The apparatus of claim 18, wherein finding stitch locations comprises:

performing the first two-way coloring, the second two-way coloring, and the third two-way coloring for tip-to-tip and tip-to-side conflicts; and performing the first two-way coloring and the third two-way coloring for side-to-side conflicts.

* * * * *